US012811576B2

(12) United States Patent
Hsiao et al.

(10) Patent No.: US 12,811,576 B2
(45) Date of Patent: Nov. 24, 2026

(54) DELAY CELLS WITH CONSTANT OUTPUT DELAY

(71) Applicant: Apple Inc., Cupertino, CA (US)

(72) Inventors: Keng Jan Hsiao, San Jose, CA (US); Craig B. Byington, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 11 days.

(21) Appl. No.: 19/020,670

(22) Filed: Jan. 14, 2025

(65) Prior Publication Data

US 2026/0205101 A1 Jul. 16, 2026

(51) Int. Cl.
*H03K 5/134* (2014.01)
*H03K 5/00* (2006.01)

(52) U.S. Cl.
CPC ..... *H03K 5/134* (2014.07); *H03K 2005/0013* (2013.01); *H03K 2005/00202* (2013.01)

(58) Field of Classification Search
CPC ........... H03K 5/134; H03K 2005/0013; H03K 2005/00202
See application file for complete search history.

(56) References Cited

U.S. PATENT DOCUMENTS 6,044,027 A * 3/2000 Zheng .................... H03K 5/133 365/194
6,262,616 B1 7/2001 Srinivasan et al.
7,952,370 B2 5/2011 Ferraiolo et al.
8,294,525 B2 10/2012 Bulzacchelli et al.
8,390,352 B2 3/2013 Seefeldt et al.
9,177,622 B2 * 11/2015 Sforzin .................. G11C 7/222
9,229,465 B2 1/2016 Dhiman et al.
10,686,452 B2 6/2020 Deng et al.
10,812,056 B1 * 10/2020 Wu ........................ H03K 5/134
10,826,473 B2 11/2020 Liu et al.
2006/0176096 A1 8/2006 Dreps et al.
2007/0046345 A1 * 3/2007 Tai .......................... H03L 7/095 327/158
2009/0261879 A1 * 10/2009 Sinha .................... G11C 11/406 327/261
2018/0246160 A1 * 8/2018 Huang ............... G01R 31/2607

FOREIGN PATENT DOCUMENTS

CA 2227097 C 1/2001
CN 109450415 B 3/2019
EP 0272479 A2 * 6/1988 ........... H03K 5/2418
KR 0199215 B1 6/1999
KR 0289385 B1 5/2001
KR 20090097552 A 9/2009

* cited by examiner

*Primary Examiner* — Metasebia T Retebo
(74) *Attorney, Agent, or Firm* — Aikin & Gallant, LLP

(57) ABSTRACT

A system for generating an output voltage signal may include bias generation circuitry utilizing a first reference transistor and a second reference transistor to produce a bias signal; and inverter circuitry utilizing the bias signal to produce an output voltage signal based on an input voltage signal. The bias signal causes biasing of a current source and a current sink to maintain a constant output delay of a first transistor (matching the first reference transistor) and a second transistor (matching the second reference transistor) to produce the output voltage signal based on the input voltage signal. Other aspects are also described and claimed.

20 Claims, 8 Drawing Sheets

DELAY CELLS WITH CONSTANT OUTPUT DELAY

BACKGROUND

Field

This disclosure relates generally to delay lines for integrated circuits and, more specifically, to delay lines that include delay cells that maintain a constant output delay. Other aspects are also described.

Background Information

A delay line refers to circuitry utilized to add some amount of delay to a system. A delay line may be used to synchronize signals between circuits of the system. For example, in memory systems, such as double data rate (DDR) memory, a delay line may be used to align multiple data bits and/or shift strobe signals between a memory controller and a memory. Other examples of applications may include a delay locked loop (DLL) and a ring oscillator.

Traditionally, a delay line is comprised of a series of delay cells formed by logic inverters implemented by inverter circuitry (or simply an inverter). Each delay cell may receive an input voltage signal, e.g., a clock signal or strobe, and produce an output voltage signal while introducing an amount of delay.

SUMMARY

Implementations of this disclosure include biasing a current source (e.g., including a header transistor) and a current sink (e.g., including a footer transistor) of inverter circuitry of a delay cell to reduce the effect of power supply variation on an output delay of the inverter circuitry to produce an output voltage signal. The current source and the current sink may be biased in a linear region (unsaturated) of the devices to produce a dynamic slew rate of the output voltage signal that varies with variation of the supply voltage (e.g., output current of the inverter circuitry varying proportionally with the supply voltage). The dynamic slew rate maintains a consistent trip point of the inverter circuitry in time to maintain a constant output delay to produce the output voltage signal. The controlled biasing enables the inverter circuitry to perform as a hybrid between a standard inverter that produces a variable slew rate, resulting in a negative delay coefficient, and a current-starved inverter that produces a constant slew rate resulting in a positive delay coefficient. The bias signal causes a biasing of the inverter circuitry (e.g., the current source and the current sink) that offsets the negative delay coefficient (of the standard inverter) by the positive delay coefficient (of the current-starved inverter) to maintain the constant output delay.

Some implementations may include a system for generating an output voltage signal, including: bias generation circuitry utilizing a first reference transistor and a second reference transistor to produce a bias signal; and inverter circuitry utilizing the bias signal to produce an output voltage signal based on an input voltage signal, the inverter circuitry including: a current source; a first transistor coupled to the current source, the first transistor matching one or more process parameters and a transistor type of the first reference transistor; a second transistor coupled to the first transistor, the second transistor matching one or more process parameters and a transistor type of the second reference transistor; and a current sink coupled to the second transistor, wherein the bias signal causes biasing of the current source and the current sink to maintain a constant output delay of the first transistor and the second transistor to produce the output voltage signal based on the input voltage signal.

Some implementations may include a method for generating an output voltage signal, including: configuring a plurality of delay cells in a delay line, each delay cell including inverter circuitry to produce an output voltage signal based on an input voltage signal, each inverter circuitry including a current source, a first transistor coupled to the current source, a second transistor coupled to the first transistor, and a current sink coupled to the second transistor; generating a bias signal utilizing a first reference transistor and a second reference transistor, the first transistor matching one or more process parameters and a transistor type of the first reference transistor, the second transistor matching one or more process parameters and a transistor type of the second reference transistor; and biasing the current source and the current sink based on the bias signal to maintain a constant output delay of the first transistor and the second transistor to produce the output voltage signal based on an input voltage signal. Other aspects are also described and claimed.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the Claims section. Such combinations may have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Figure 1:
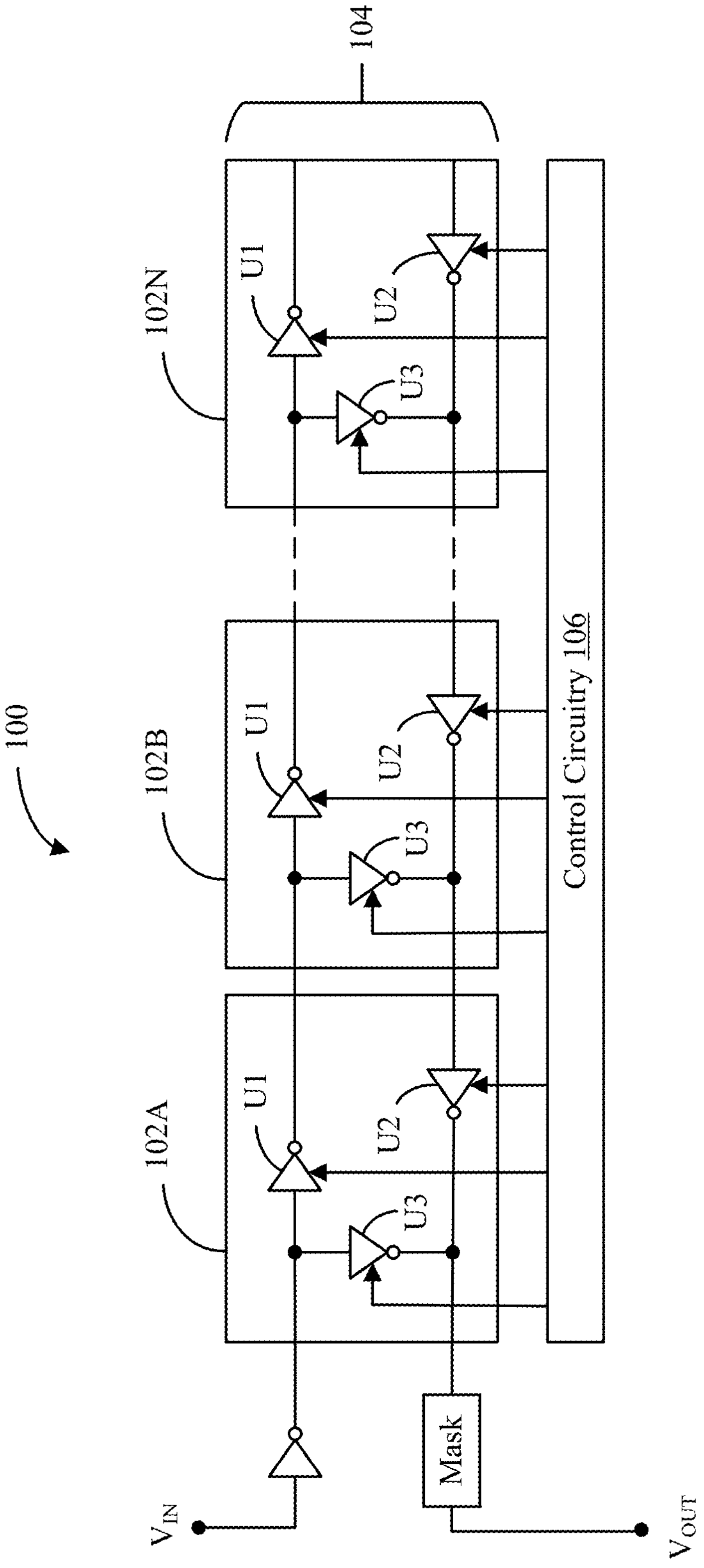
FIG. 1 is an example of a system including delay cells in a delay line.

Conventional delay lines include delay cells with inverter circuitry coupled to a supply voltage. The supply voltage may be susceptible to variation due to power supply induced noise or jitter. This supply voltage variation, in turn, can cause variation of output delays of the inverter circuitry due to the output driving current of the inverter circuitry being proportional to the square of the supply voltage. However, the variation of output delays may be undesirable due to a potential loss of accuracy of the delay line to control timing.

To maintain a constant output delay of delay cells, a low dropout (LDO) voltage regulator is sometimes used to keep the supply voltage stable. An LDO regulator is a type of DC linear voltage regulator that can operate when the supply voltage is close to the output voltage. However, LDO regulators, like other voltage regulators, may consume significant amounts of power and physical area in a system. It is therefore desirable for systems utilizing delay cells in a delay line to maintain a constant output delay to control accuracy, including with variations of the supply voltage, but without added power consumption, heat, physical area, and/or complexity associated with an LDO regulator.

Implementations of this disclosure address problems such as these by biasing a current source (e.g., including a header transistor) and a current sink (e.g., including a footer transistor) of inverter circuitry of a delay cell to reduce the effect of power supply variation (e.g., noise or jitter) on an output delay of the inverter circuitry to produce an output voltage signal. The current source and the current sink may be biased in a linear region (unsaturated) of the devices to produce a dynamic slew rate of the output voltage signal that varies with variation of the supply voltage (e.g., output current of the inverter circuitry varying proportionally with the supply voltage). The dynamic slew rate maintains a consistent trip point of the inverter circuitry in time to maintain a constant output delay to produce the output voltage signal. The controlled biasing enables the inverter circuitry to perform as a hybrid between a standard inverter that produces a variable slew rate, resulting in a negative delay coefficient, and a current-starved inverter that produces a constant slew rate resulting in a positive delay coefficient. The bias signal causes a biasing of the inverter circuitry (e.g., the current source and the current sink) that offsets the negative delay coefficient (of the standard inverter) by the positive delay coefficient (of the current-starved inverter) to maintain the constant output delay.

In various embodiments, the biasing may be generated by (global) bias generation circuitry that utilizes reference transistors that match transistors of the inverter circuitry to produce the bias signal for multiple delay lines. The bias generation circuitry may utilize the reference transistors to track process and/or temperature variations of the inverter circuitry, and therefore driving strength of the inverter circuitry, to produce the bias signal and maintain the biasing in the linear region. Local bias circuitry, in turn, may generate a first bias signal to bias the current source and a second bias signal to bias the current sink based on the bias signal. In some cases, the bias signal may include a reference current that causes the local bias circuitry to produce a first bias voltage to bias a header transistor of the current source and a second bias voltage to bias a footer transistor of the current sink. The biasing may cause the inverter circuitry to operate in the linear region of the devices (e.g., the header and footer transistors) where the output current of the inverter circuitry may be proportional to the supply voltage. As a result, systems utilizing a delay cell with the inverter circuitry described herein can maintain a constant output delay, despite variations of the supply voltage. This may be utilized, for example, to control accuracy in a delay line producing a timing signal. Further, this may enable aa reduction in power consumption, heat, physical area, and/or complexity in a system by eliminating the need for an LDO regulator.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

FIG. 1 is an example of a system 100 including a plurality of delay cells, such as delay cells 102A to 102N where N is an integer greater than one. The delay cells may be coupled to one another in series to form a delay line 104. The delay line 104 may be utilized to add some amount of delay to a voltage signal in a system, such as clock signal or strobe to synchronize between circuits. For example, the delay line 104 may be used in a memory system, such as DDR memory to align multiple data bits and/or shift strobe signals between a memory controller and memory. In other examples, the delay line 104 may be used in a DLL or ring oscillator.

Each delay cell may be coupled to a first supply voltage $V_{DD}$ (e.g., a power supply) and a second supply voltage $V_{SS}$ (e.g., a reference, such as ground). Each delay cell may include one or more inverters to produce an output voltage signal $V_{OUT}$ (inverted) based on an input voltage signal $V_{IN}$. For example, each delay cell may include an inverter U1 to propagate a voltage signal from an earlier, upstream delay cell to a later, downstream delay cell with an added delay when enabled (e.g., lengthening the delay line 104); an inverter U2 to return a voltage signal from a downstream delay cell to an upstream delay cell when enabled (e.g., a return path of the delay line 104); and an inverter U3 to return a voltage signal from an upstream delay cell back to the upstream delay cell when enabled (e.g., terminating the delay line 104). The system 100 may utilize control circuitry 106 (including mask circuitry receiving the output voltage signal $V_{OUT}$ to clamp high voltage signals and low voltage signals) to digitally control and configure the delay cells of the delay line 104, including by selectively enabling or disabling the inverters U1 to U3 to determine the number of delay cells to be used in the series (e.g., inverter chain).

Figure 2:
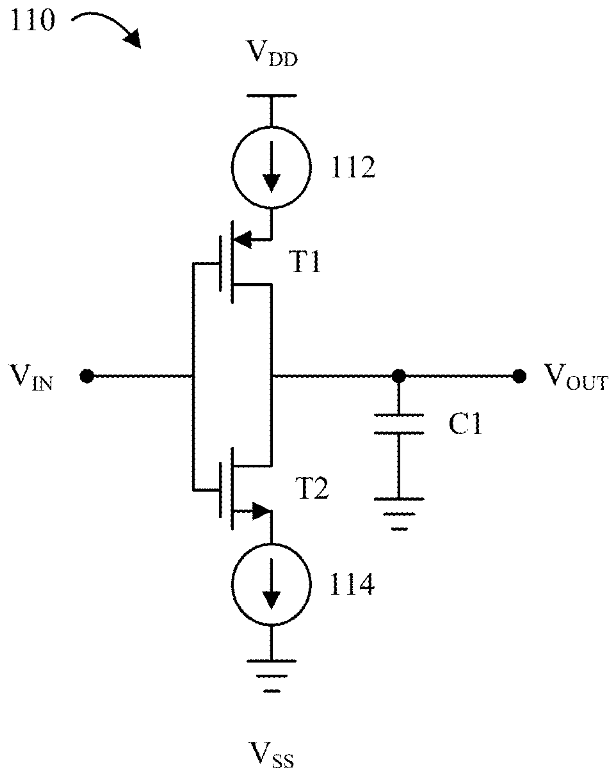
FIG. 2 is an example of inverter circuitry of a delay cell.

FIG. 2 is an example of inverter circuitry 110 of a delay cell, such as one of the delay cells 102A, 102B, etc. The inverter circuitry 110 may be utilized to implement the inverters U1 to U3 of a delay cell. The inverter circuitry 110 may include a current source 112, a transistor T1 (e.g., first transistor), a transistor T2 (e.g., second transistor), a current sink 114, and a load, represented by capacitor C1. The current source 112 may be coupled to the first supply voltage $V_{DD}$ and transistor T1. For example, the current source 112 may comprise a header transistor (e.g., transistor T3 in FIG. 6), such as a p-type metal oxide semiconductor field effect transistor (MOSFET), or simply PMOS transistor, with its source connected to the first supply voltage $V_{DD}$ and its drain connected to transistor T1. Transistors T1 and T2 may together form a complementary metal oxide semiconductor (CMOS) logic inverter. For example, transistor T1 may be a PMOS transistor with its source connected to the current source 112 and its drain connected to transistor T2. Transistor T2 may be an n-type metal MOSFET, or simply NMOS transistor, with its drain connected to the drain of transistor T1 and its source connected to the current sink 114. Gates of transistors T1 and T2 may be tied together to receive the input voltage signal $V_{IN}$. Drains of transistors T1 and T2 may be tied together to produce the output voltage signal $V_{OUT}$ (the input voltage signal $V_{IN}$ inverted). The current sink 114 may be coupled to transistor T2 and the second supply voltage $V_{SS}$. For example, the current sink 114 may comprise a footer transistor (e.g., transistor T4 in FIG. 6), such as an NMOS transistor with its drain connected to transistor T2 and its source connected to the second supply voltage $V_{SS}$.

The inverter circuitry 110 may receive a first bias signal to bias the current source 112 (e.g., a first bias voltage received at a gate of the header transistor) and a second bias signal to bias the current sink 114 (e.g., a second bias voltage received at a gate of the footer transistor). The first bias signal and the second bias signal may be generated by local bias circuitry based on a controlled bias signal (e.g., a reference current) from (global) bias generation circuitry. The bias generation circuitry can bias the current source 112 (e.g., including the header transistor) and the current sink 114 (e.g., including the footer transistor) to reduce the effect of variation of the first supply voltage $V_{DD}$ and/or the second supply voltage $V_{SS}$ on output delay of the inverter circuitry 110 to produce the output voltage signal $V_{OUT}$.

The current source 112 and the current sink 114 may be selectively biased, based on the bias signal, in a linear region (unsaturated) of the devices to produce a dynamic slew rate of the output voltage signal $V_{OUT}$ that varies with variation of the first supply voltage $V_{DD}$ and/or the second supply voltage $V_{SS}$ (e.g., output current of the inverter circuitry 110 controlled to vary proportionally with the supply voltage). The dynamic slew rate maintains a consistent trip point of the inverter circuitry 110 in time to maintain a constant output delay to produce the output voltage signal $V_{OUT}$. The biasing enables the inverter circuitry 110 to perform as a hybrid between a standard inverter that produces a variable slew rate, resulting in a negative delay coefficient, and a current-starved inverter that produces a constant slew rate resulting in a positive delay coefficient. The bias signal causes biasing of the current source 112 and the current sink 114 to offset the negative delay coefficient (of the standard inverter) by the positive delay coefficient (of the current-starved inverter) to maintain the constant output delay.

Figure 3:
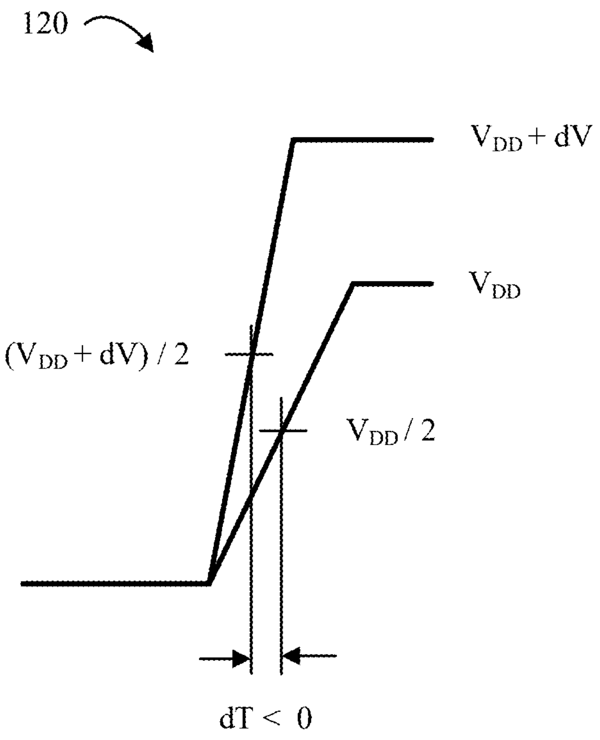
FIG. 3 is an example of a variable slew rate resulting in a negative delay coefficient.

By way of example, FIG. 3 illustrates a variable slew rate 120 associated with a standard inverter (e.g., a traditional inverter, without a current source and/or a current sink 114) resulting in a negative delay coefficient. The negative delay coefficient may be represented by $dT<0$ caused by the variable slew rate of the output voltage signal $V_{OUT}$ from cycle to cycle due variation to the first supply voltage $V_{DD}$. The variable slew rate causes a variable trip point in time, resulting in negative delays to produce the output voltage signal $V_{OUT}$. As described herein, an increase of the first supply voltage $V_{DD}$ causing a decrease of the output delay is referred to as a positive delay. For example, a first supply voltage of $V_{DD}$ may result in a first slew rate of the output voltage signal $V_{OUT}$ in a first cycle. The first slew rate, in turn, may result in a first trip point of the standard inverter at $V_{DD}/2$, producing the output voltage signal $V_{OUT}$ with a first output delay. Then, a higher first supply voltage of $V_{DD}+dV$ (due to noise) may result in a higher, second slew rate of the output voltage signal $V_{OUT}$ in a second cycle. The second slew rate, in turn, may result in an earlier, second trip point of the standard inverter at $(V_{DD}+dV)/2$, producing the output voltage signal $V_{OUT}$ earlier in time with a negative delay relative to the previous cycle. Thus, a standard inverter may not maintain a constant output delay from cycle to cycle with variation of the supply voltage (e.g., a higher supply voltage may result in a lesser output delay).

Figure 4:
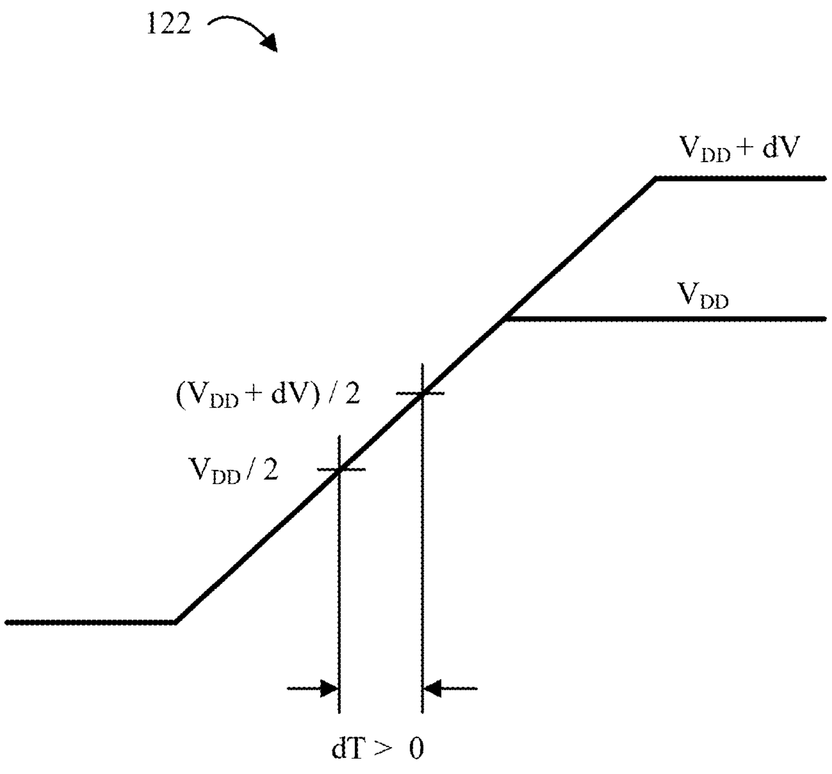
FIG. 4 is an example of a constant slew rate resulting in a positive delay coefficient.

In another example, FIG. 4 illustrates a constant slew rate 122 associated with a current-starved inverter (e.g., a current source dominant inverter with a current source and/or a current sink, but without biasing in the linear region as described herein) resulting in a positive delay coefficient. A current-starved inverter may refer to an inverter that receives an input voltage signal and generates an output voltage signal with a constant slew rate. The positive delay coefficient may be represented by $dT>0$ caused by the constant slew rate of the output voltage signal $V_{OUT}$ from cycle to cycle due variation to the first supply voltage $V_{DD}$. The constant slew rate causes a variable trip point in time, resulting in positive delays to produce the output voltage signal $V_{OUT}$. As described herein, an increase of the first supply voltage $V_{DD}$ causing an increase of the output delay is referred to as a positive delay. For example, a first supply voltage of $V_{DD}$ may result in a first slew rate of the output voltage signal $V_{OUT}$ in a first cycle. The first slew rate, in turn, may result in a first trip point of the current-starved inverter at $V_{DD}/2$, producing the output voltage signal $V_{OUT}$ with a first output delay. Then, a higher first supply voltage of $V_{DD}+dV$ (due to noise) may result in the same, constant slew rate of the output voltage signal $V_{OUT}$ in a second cycle. The constant slew rate, in turn, may result in a later, second trip point of the current-starved inverter at $(V_{DD}+dV)/2$, producing the output voltage signal $V_{OUT}$ later in time with positive delay relative to the previous cycle. Thus, a current-starved inverter may not maintain a constant output delay from cycle to cycle with variation of the supply voltage (e.g., a higher supply voltage may result in a greater output delay).

Figure 5:
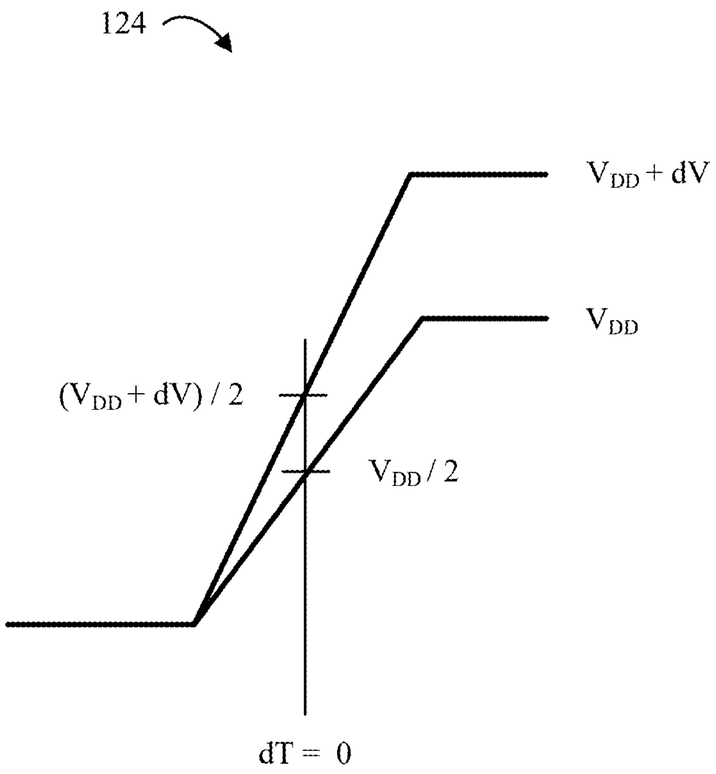
FIG. 5 is an example of a dynamic slew rate resulting in a constant output delay.

In contrast, FIG. 5 illustrates a dynamic slew rate 124 associated with the inverter circuitry 110 (e.g., with biasing of the current source 112 and the current sink 114 in the linear region) resulting in a constant output delay. The constant output delay may be represented by $dT=0$ caused by the dynamic slew rate of the output voltage signal $V_{OUT}$ from cycle to cycle, despite variation to the first supply voltage $V_{DD}$, due to the biasing. The dynamic slew rate causes a variable trip point in time that results in an offset of the negative delay coefficient (associated with the standard inverter) by the positive delay coefficient (associated with the current-starved inverter). This maintains the constant output delay over dV to produce the output voltage signal $V_{OUT}$. For example, a first supply voltage of $V_{DD}$ may result in a first dynamic slew rate of the output voltage signal $V_{OUT}$ in a first cycle. The first dynamic slew rate, in turn, may result in a first trip point of the inverter circuitry 110 at $V_{DD}/2$, producing the output voltage signal $V_{OUT}$ with an output delay. Then, a higher first supply voltage of $V_{DD}+dV$ (due to noise) may result in a second dynamic slew rate of the output voltage signal $V_{OUT}$ in a second cycle. However, based on utilizing the bias signal, the second dynamic slew rate, in turn, results in a same, constant trip point of the inverter circuitry 110 at $(V_{DD}+dV)/2$, producing the output voltage signal $V_{OUT}$ at the same time without a positive or negative delay (e.g., a higher supply voltage may result in the same, constant output delay).

As a result, a constant output delay is maintained with variable, dynamic slew rates. In particular, the dynamic slew rate of the inverter circuitry 110 maintains a consistent trip point in time which, in turn, maintains a constant output delay to produce the output voltage signal $V_{OUT}$. The biasing enables the inverter circuitry 110 to keep the consistent trip point, performing as a hybrid between the standard inverter (e.g., FIG. 3) that produces the variable slew rate, resulting in a negative delay coefficient, and the current-starved inverter (e.g., FIG. 4) that produces a constant slew rate resulting in a positive delay coefficient. The bias signal (e.g., reference current) causes a biasing of the inverter circuitry 110 (e.g., the current source 112 and the current sink 114) to offset the negative delay coefficient by the positive delay coefficient to maintain the constant output delay from cycle to cycle with variation of the first supply voltage $V_{DD}$ and/or the second supply voltage $V_{SS}$. For example, increasing the bias signal (reference current) can increase the negative delay coefficient, while decreasing the bias signal can increase the positive delay coefficient, such that balancing the bias signal can offset the negative delay coefficient by the positive delay coefficient to maintain the constant output delay.

Figure 6:
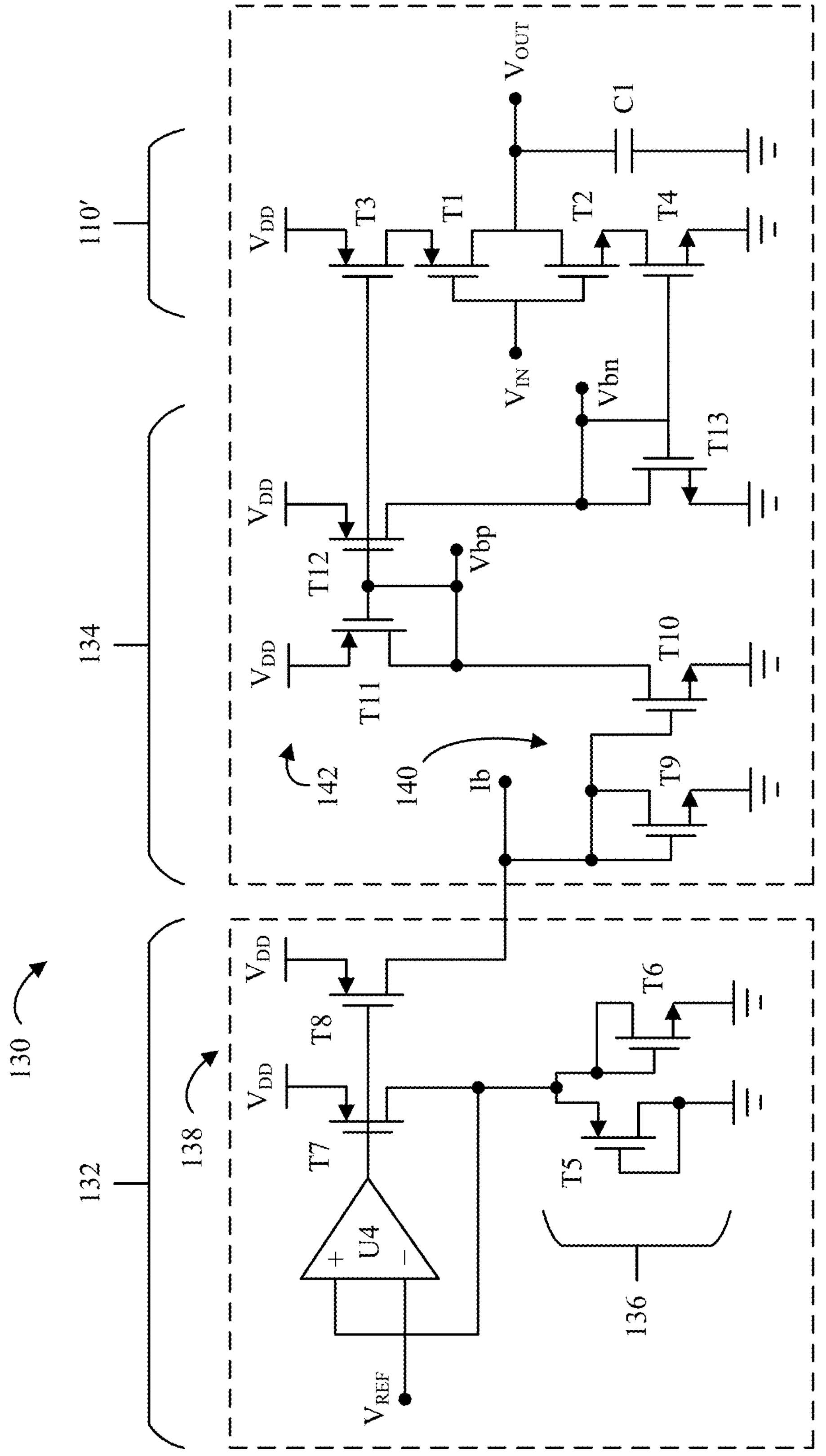
FIG. 6 is an example of bias generation circuitry and inverter circuitry.

FIG. 6 is an example of a system 130 including bias generation circuitry 132, local bias circuitry 134, and inverter circuitry 110'. The inverter circuitry 110' may be an embodiment of the inverter circuitry 110 shown in FIG. 2. The inverter circuitry 110' may be utilized to implement inverters in a delay cell of a delay line like the inverters U1 to U3 shown in FIG. 1.

The bias generation circuitry 132 may include an operational amplifier U4, reference circuitry 136, and output circuitry 138. In some cases, the bias generation circuitry 132 may include global bias generation circuitry to generate a global bias signal for multiple delay lines like the delay line 104. The reference circuitry 136 may include a transistor T5 (e.g., a first reference transistor, such as a PMOS transistor) and a transistor T6 (e.g., a second reference transistor, such as an NMOS transistor). The output circuitry 138 may include transistors T7 and T8 (e.g., PMOS transistors with sources coupled to the first supply voltage $V_{DD}$). The operational amplifier U4 may receive a reference voltage signal $V_{REF}$ at an inverting input (−) and a feedback signal at a non-inverting input (+). The operational amplifier U4 may drive an output signal to the output circuitry 138 (e.g., gates of the transistors T7 and T8). The output circuitry 138, in turn, may be coupled to the reference circuitry 136 to produce the feedback signal (e.g., drain of transistor T7 coupled to source of transistor T5 and drain of transistor T6, and coupled to the non-inverting input of the operational amplifier U4). The output circuitry 138 may utilize a current mirror to produce a bias signal Ib (e.g., a reference current), which may be based on the output signal from the operational amplifier U4 (e.g., drain of transistor T8) and the feedback signal coupled to the reference circuitry 136.

The reference circuitry 136 may include reference transistors matching one or more process parameters and transistor types of transistors of the inverter circuitry 110'. For example, the one or more process parameters may include a threshold voltage $V_{TH}$, oxide thickness $T_{OX}$, and/or carrier mobility μ of a transistor, where a drain current of the transistor equals $I_D=(½)*\mu*C_{OX}*(W/L)*(V_{GS}-V_{TH})^2$, with $C_{OX}$ corresponding to gate oxide capacitance of the transistor (calculated as $\varepsilon ox/T_{ox}$, where εox corresponds to permittivity of the oxide material), $V_{GS}$ corresponding to the gate to source voltage of the transistor, and W and L corresponding to width and length of the transistor, respectively. The transistor types may include, for example, PMOS or NMOS types. Transistor T5 matches the one or more process parameters and transistor type (e.g., PMOS) of transistor T1, and transistor T6 matches the one or more process parameters and transistor type (NMOS) of transistor T2.

Further, the reference transistors, transistor T5 and T6, may be configured as diodes in the bias generation circuitry 132 (e.g., gate and drain of transistor T5 coupled to the second supply voltage $V_{SS}$, and gate and drain of transistor T6 coupled to the second supply voltage $V_{SS}$). Based on the reference transistors, transistor T5 and T6, matching the one or more process parameters and transistor types of transistors T1 and T2 of the inverter circuitry 110', the bias signal Ib may be produced to vary with process and temperature variations of the inverter circuitry 110'.

In some implementations, while the reference transistors, transistor T5 and T6, may match process parameters and transistor types of transistors of the inverter circuitry 110', the reference transistors may differ in size (e.g., width (W) and/or length (L)) relative to transistors of the inverter circuitry 110'. For example, transistors T5 and T6 may be smaller, having a smaller width W and/or length L relative to transistors T1 and T2, which may be larger, thus differing in size. This may enable the bias generation circuitry 132 to utilize smaller transistors to track process and temperature variations of the transistors T1 and T2, and therefore driving strength of the transistors T1 and T2, while the inverter circuitry 110' may utilize larger transistors to source and sink current to produce the output voltage signal $V_{OUT}$.

The bias signal Ib may cause local bias circuitry 134 to generate a first bias signal Vbp and a second bias signal Vbn. For example, the local bias circuitry 134 may be local to delay cells of a delay line, such as the delay line 104 shown in FIG. 1. The local bias circuitry 134 may include a first current mirror 140 comprised of transistors T9 and T10 (e.g., NMOS transistors with gates tied together to receive the bias signal Ib, and sources coupled to the second supply voltage $V_{SS}$) coupled to a second current mirror 142 comprised of transistors T11 and T12 (e.g., PMOS transistors with gates tied together and sources coupled to the first supply voltage $V_{DD}$).

The first current mirror 140 may receive the bias signal Ib that comprises a reference current (e.g., via a gate and drain tied together of transistor T9). The first current mirror 140 may then produce the first bias signal Vbp (e.g., via drain of transistor T10) as a first bias voltage to bias a current source of the inverter circuitry 110'. For example, the current source may include transistor T11 and a header transistor T3 (e.g., a PMOS transistor with a source coupled to the first supply voltage $V_{DD}$, a drain coupled to the source of transistor T1, and a gate coupled to transistor T11, receiving the first bias voltage at the gate).

The second current mirror 142 may then produce the second bias signal Vbn (e.g., via drain of transistor T12) as a second bias voltage to bias a current sink of the inverter circuitry 110'. For example, the current sink may include a transistor T13 (e.g., an NMOS transistor with a source coupled to the second supply voltage $V_{SS}$, and a gate and drain coupled to a gate of transistor T4 and the second current mirror 142, configured as a diode) and a footer transistor T4 (e.g., an NMOS transistor with a source coupled to the second supply voltage $V_{SS}$, a drain coupled to the source of transistor T2, and a gate coupled to transistor T13, receiving the second bias voltage at the gate).

As a result, biasing in the system 130 may be generated by the bias generation circuitry 132 utilizing transistors T5 and T6, matching transistors T1 and T2 of the inverter circuitry 110', respectively, to produce the bias signal Ib. The bias generation circuitry 132 can support biasing for multiple delay cells of multiple delay lines. The bias generation circuitry 132 utilizes transistors T5 and T6 to track process and/or temperature variations of transistors T1 and T2, and therefore driving strength of transistors T1 and T2, respectively, to produce the bias signal Ib and maintain biasing of the inverter circuitry 110' in the linear region.

The local bias circuitry 134, in turn, may generate the first bias signal Vbp to bias the current source (e.g., including header transistor T3) and the second bias signal Vbn to bias the current sink (e.g., including a footer transistor T4). In some cases, the first bias signal Vbp may be a first bias voltage applied to the gate of the header transistor T3 to control $V_{GS}$ to bias the header transistor T3, and the second bias signal Vbn may be a second bias voltage applied to the gate of the footer transistor T4 to control $V_{GS}$ to bias the footer transistor T4. $V_{GS}$ refers to the gate to source voltage of a transistor, to turn the transistor by some degree, relative to the threshold voltage $V_{TH}$. The biasing may cause the inverter circuitry 110' to operate in the linear region of the transistors (e.g., transistors T3 and T4) where the output current of the inverter circuitry 110' may be proportional to the first supply voltage $V_{DD}$ and/or the second supply voltage $V_{SS}$. Systems utilizing a delay cell with the inverter circuitry 110' can then maintain a constant output delay, despite variations of the supply voltage. The constant output delay may be maintained with variable slew rates (e.g., FIG. 5). This may be utilized to control accuracy in a delay line. Further, this may enable a reduction in power consumption, heat, physical area, and/or complexity in systems by eliminating the need for an LDO regulator.

Figure 7:
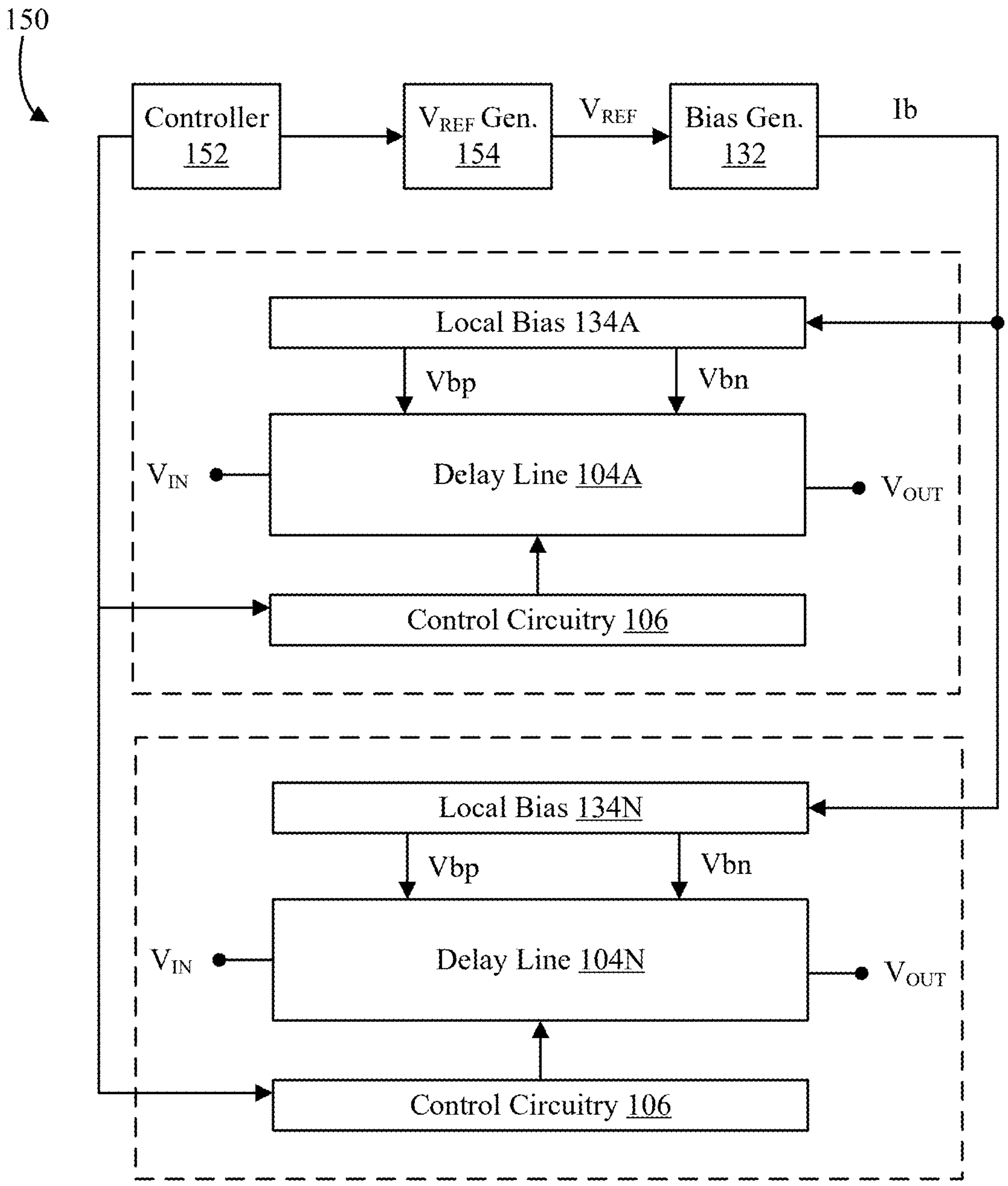
FIG. 7 is an example of a system including a plurality of delay lines.

FIG. 7 is an example of a system 150 including a plurality of delay lines, such as delay lines 104A to 104N where N is an integer greater than one. For example, delay line 104A may be used to control timing in a first system, such as a DDR memory system, delay line 104N may be used to control timing in a second system, such as a DLL, etc. In the system 150, one or more controllers, such as a controller 152, may program control circuitry 106 to configure each delay line (e.g., to selectively enable inverter circuitry of one or more delay cells of the delay lines). The controller 152 can also control reference voltage generation circuitry 154 to generate a reference voltage signal $V_{REF}$. For example, the controller 152 can adjust the reference voltage generation circuitry 154 to generate a reference voltage signal $V_{REF}$ based on frequency.

The bias generation circuitry 132 (e.g., global bias generation circuitry) can utilize the reference voltage signal $V_{REF}$ and reference circuitry (e.g., the reference circuitry 136, including transistors T5 and T6) to produce a bias signal Ib (e.g., a global bias signal). Thus, a single instance of the reference transistors may be utilized to generate the bias signal Ib for a plurality of delay lines. Then, local bias circuitry 134 corresponding to each delay line, such as local bias circuitry 134A corresponding to delay line 104A, and local bias circuitry 134N corresponding to delay line 104N, may each receive the bias signal Ib to produce a first bias signal Vbp and a second bias signal Vbn based on the bias signal Ib. The biasing, via the first bias signals, may then cause a current source (e.g., first bias signal Vbp biasing the header transistor T3) and a current sink (e.g., second bias signal Vbn biasing the footer transistor T4) of inverter circuitry of the delay cells of a delay line to maintain a constant output delay of the delay cells to produce an output voltage signal $V_{OUT}$. As a result, delay cells of the delay lines can maintain a constant output delay, despite variations of the first supply voltage $V_{DD}$ and/or the second supply voltage $V_{SS}$.

Reference is now made to flowcharts of examples of processes for generating an output voltage signal. The processes can be executed using computing devices, such as the systems, hardware, and software described with respect to FIGS. 1-7. The processes can be performed, for example, by executing a machine-readable program or other computer-executable instructions, such as routines, instructions, programs, or other code. The operations of the processes or other techniques, methods, or algorithms described in connection with the implementations disclosed herein can be implemented directly in hardware, firmware, software executed by hardware, circuitry, or a combination thereof.

For simplicity of explanation, the processes are depicted and described herein as a series of operations. However, the operations in accordance with this disclosure can occur in various orders and/or concurrently. Additionally, other operations not presented and described herein may be used. Furthermore, not all illustrated operations may be required to implement a process in accordance with the disclosed subject matter.

Figure 8:
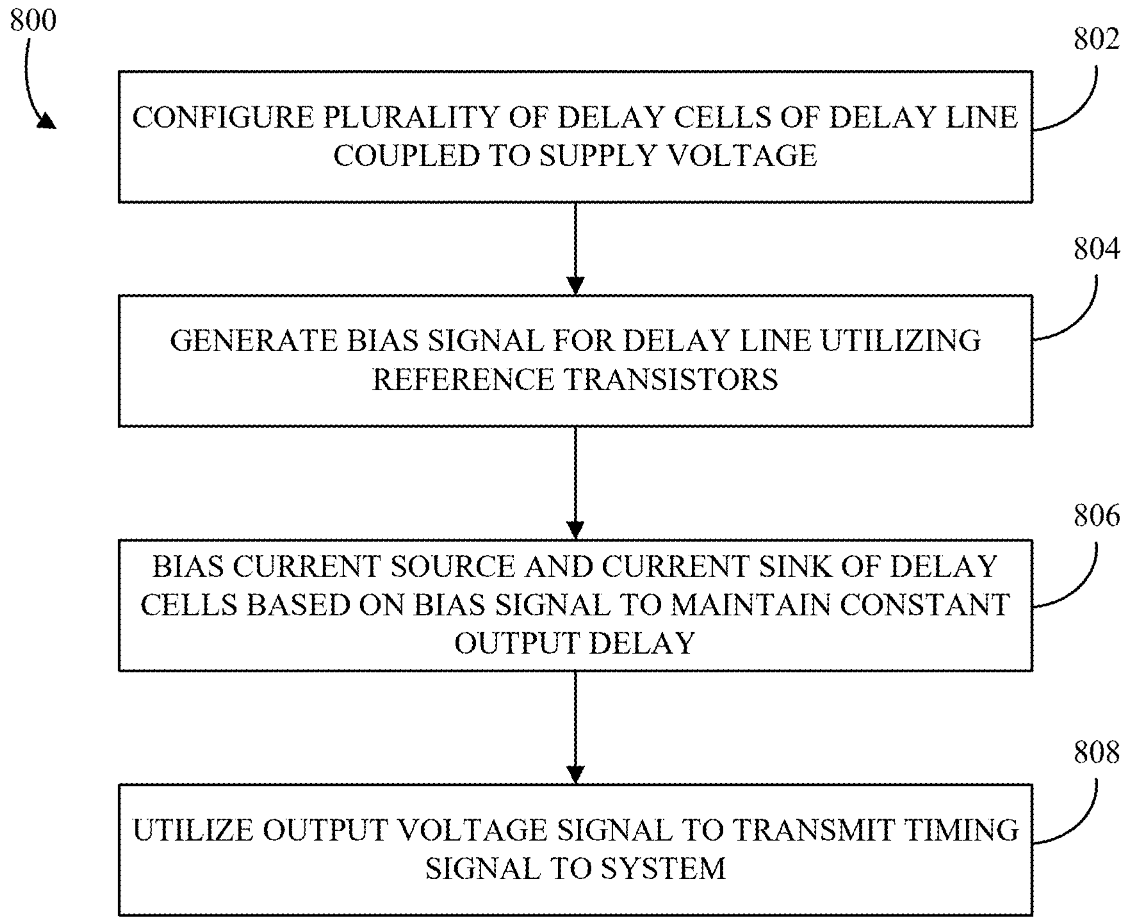
FIG. 8 is an example of a process for generating an output voltage signal.

FIG. 8 is an example of a process 800 for generating an output voltage signal. At operation 802, a system can configure a plurality of delay cells 102A to 102N in a delay line 104 (e.g., by selectively enabling inverter circuitry of one or more delay cells of the delay line). Each delay cell may include inverter circuitry, such as inverter circuitry 110 or inverter circuitry 110', to produce an output voltage signal $V_{OUT}$ based on an input voltage signal $V_{IN}$. Each inverter circuitry may include a current source (e.g., the current source 112, including the header transistor T3), a first transistor (e.g., transistor T1) coupled to the current source, a second transistor (e.g., transistor T2) coupled to the first transistor, and a current sink (e.g., the current sink 114, including the footer transistor T4) coupled to the second transistor. For example, the controller 152 can program the control circuitry 106 to configure the delay cells in the delay line, such as by selectively enabling or disabling inverters U1 to U3 (e.g., FIG. 1) of each delay cell to determine the number of delay cells to be used.

At operation 804, the system can generate the bias signal Ib utilizing matching, reference transistors implemented by reference circuitry (e.g., reference circuitry 136). For example, the reference transistors may include a first reference transistor T5 and a second reference transistor T6, configured as diodes, to provide feedback to an operational amplifier that receives a reference voltage signal $V_{REF}$. The first transistor T1 may match one or more process parameters and a transistor type of the first reference transistor T5, and the second transistor T2 may match one or more process parameters and a transistor type of the second reference transistor T6, respectively.

At operation 806, the system can bias the current source and the current sink of the selectively enabled delay cells, based on the bias signal Ib, to maintain a constant output delay of the first transistor T1 and the second transistor T2, to produce the output voltage signal $V_{OUT}$ (based on the input voltage signal $V_{IN}$). For example, the local bias circuitry 134 can produce the first bias signal Vbp and the second bias signal Vbn to bias the current source and the current sink, respectively, to maintain the constant output delay. The constant output delay may be maintained with variable slew rates (e.g., FIG. 5). In particular, the biasing may cause a dynamic slew rate of the inverter circuitry that maintains a consistent trip point in time to maintain the constant output delay. The biasing enables the inverter circuitry 110 to keep the consistent trip point to perform as a hybrid between a standard inverter and a current-starved inverter. The bias signal Ib causes a biasing of the inverter circuitry 110, via the first bias signal Vbp and the second bias signal Vbn, to offset a negative delay coefficient by a positive delay coefficient to maintain the constant output delay from cycle to cycle with variation of the first supply voltage $V_{DD}$ and/or the second supply voltage $V_{SS}$.

At operation 808, the system can utilize an output voltage signal $V_{OUT}$ of a delay cell of the delay line to transmit a timing signal in the system. For example, the output voltage signal $V_{OUT}$ may be transmitted as a clock signal or strobe. The output voltage signal $V_{OUT}$ may be used to synchronize timing between circuits, such as a memory system (e.g., a DDR memory, to align multiple data bits and/or shift strobe signals between a memory controller and memory), DLL, or a ring oscillator.

As used herein, the term "circuitry" refers to an arrangement of electronic components (e.g., transistors, resistors, capacitors, and/or inductors) that is structured to implement one or more functions. For example, a circuit may include one or more transistors interconnected to form logic gates that collectively implement a logical function.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. A system for generating an output voltage signal, comprising:

bias generation circuitry receiving a reference voltage signal, and utilizing a feedback signal produced from a first reference transistor comprising a PMOS transistor and a second reference transistor comprising an NMOS transistor, to produce a bias signal; and inverter circuitry utilizing the bias signal to produce an output voltage signal based on an input voltage signal, the inverter circuitry including:

a current source;

a first transistor comprising a PMOS transistor coupled to the current source, the first transistor matching one or more process parameters of the first reference transistor;

a second transistor comprising an NMOS transistor coupled to the first transistor, the second transistor matching one or more process parameters of the second reference transistor; and a current sink coupled to the second transistor, wherein the bias signal causes biasing of the current source and the current sink to maintain a constant output delay of the first transistor and the second transistor to produce the output voltage signal based on the input voltage signal.

2. The system of claim 1, wherein the constant output delay is maintained with variable slew rates of the output voltage signal.

3. The system of claim 1, wherein an output current of the inverter circuitry varies proportionally with a supply voltage coupled to the inverter circuitry.

4. The system of claim 1, wherein the bias signal causes local bias circuitry to generate a first bias signal to bias the current source and a second bias signal to bias the current sink.

5. The system of claim 1, wherein the bias signal comprises a reference current that causes a first bias voltage to bias a header transistor of the current source and a second bias voltage to bias a footer transistor of the current sink.

6. The system of claim 1, wherein the bias signal varies with process and temperature variations of the inverter circuitry.

7. The system of claim 1, wherein the first reference transistor and the second reference transistor are configured as diodes.

8. The system of claim 1, wherein the one or more process parameters include threshold voltage, oxide thickness, and carrier mobility.

9. The system of claim 1, wherein the first reference transistor and the second reference transistor are smaller transistors than the first transistor and the second transistor.

10. The system of claim 1, wherein a header transistor of the current source comprises a PMOS transistor, and a footer transistor of the current sink comprises an NMOS transistors.

11. The system of claim 1, wherein the first transistor relative to the first reference transistor, and the second transistor relative to the second reference transistor, differ in size.

12. The system of claim 1, wherein the bias generation circuitry utilizes an operational amplifier, coupled to the first reference transistor and the second reference transistor, to receive the reference voltage signal and the feedback signal to produce the bias signal.

13. The system of claim 1, wherein the inverter circuitry is implemented by a delay cell in a delay line comprising a plurality of delay cells.

14. The system of claim 1, wherein the output voltage signal is a clock signal.

15. A method for generating an output voltage signal, comprising:

configuring a plurality of delay cells in a delay line, each delay cell including inverter circuitry to produce an output voltage signal based on an input voltage signal, each inverter circuitry including a current source, a first transistor comprising a PMOS transistor coupled to the current source, a second transistor comprising an NMOS transistor coupled to the first transistor, and a current sink coupled to the second transistor;

generating a bias signal by receiving a reference voltage signal and utilizing a feedback signal produced from a first reference transistor comprising a PMOS transistor and a second reference transistor comprising an NMOS transistor, the first transistor matching one or more process parameters of the first reference transistor, and the second transistor matching one or more process parameters of the second reference transistor; and biasing the current source and the current sink based on the bias signal to maintain a constant output delay of the first transistor and the second transistor to produce the output voltage signal based on an input voltage signal.

16. The method of claim 15, further comprising:

utilizing the output voltage signal of a delay cell to transmit a clock signal or strobe.

17. The method of claim 15, wherein the constant output delay is maintained between delay cells in the delay line with variable slew rates of the output voltage signal.

18. The method of claim 15, wherein output currents of delay cells in the delay line vary proportionally with a supply voltage coupled to the delay line.

19. The method of claim 15, wherein the bias signal causes local bias circuitry to generate a first bias signal to bias the current source and a second bias signal to bias the current sink.

20. The method of claim 15, wherein the bias signal comprises a reference current that causes a first bias voltage to bias a header transistor of the current source and a second bias voltage to bias a footer transistor of the current sink.

* * * * *